United States Patent
Kapoor

[11] Patent Number: 5,780,350
[45] Date of Patent: Jul. 14, 1998

[54] MOSFET DEVICE WITH IMPROVED LDD REGION AND METHOD OF MAKING SAME

[75] Inventor: Ashok K. Kapoor, Palo Alto, Calif.

[73] Assignee: LSI Logic Corporation, Milpitas, Calif.

[21] Appl. No.: 791,283

[22] Filed: Jan. 30, 1997

[51] Int. Cl.⁶ .................... H01L 21/331; H01L 21/8222
[52] U.S. Cl. .................................................... 438/305
[58] Field of Search ........................ 438/303–305, 438/933

[56] References Cited

U.S. PATENT DOCUMENTS

| | | | |
|---|---|---|---|
| 5,320,974 | 6/1994 | Hori et al. | 438/305 |
| 5,389,557 | 2/1995 | Jung-Suk | 438/305 |
| 5,491,099 | 2/1996 | Hsu | 438/305 |

Primary Examiner—John Niebling
Assistant Examiner—Richard A. Booth
Attorney, Agent, or Firm—John P. Taylor

[57] ABSTRACT

LDD regions of a MOSFET device in an integrated circuit structure are formed in a semiconductor substrate, after formation of the source/drain regions of the MOSFET device by forming spacers on the sidewalls of the gate electrode prior to doping of the substrate to form source/drain regions by implantation and annealing/activating. The sidewall spacers are then removed, and the portion of the substrate exposed by removal of the spacers is then lightly doped to form the desired LDD regions in the substrate between the respective source/drain regions and a channel region of the substrate below the gate oxide. In this manner, the dopant used to form the LDD regions is not exposed to the heat used to anneal and activate the implanted source/drain regions. In a preferred embodiment, where the semiconductor substrate is a silicon substrate and the gate electrode is a polysilicon gate electrode, metal silicide contacts are also formed, respectively over the source/drain regions and the polysilicon gate electrode, prior to removal of the spacers and prior to the formation of the LDD regions, so that the dopant used to form the LDD regions is also not exposed to the heat used to form the metal silicide contacts.

15 Claims, 3 Drawing Sheets

5,780,350

MOSFET DEVICE WITH IMPROVED LDD REGION AND METHOD OF MAKING SAME

BACKGROUND OF THE INVENTION

1. Field of the Invention

This invention relates to integrated circuit structures. More particularly, this invention relates to a MOSFET device of an integrated circuit structure formed on a semiconductor substrate and having an improved LDD region, and a method of making same.

2. Description of the Related Art

In the construction of MOSFET devices in integrated circuit structures, it has become an accepted practice to form a lightly doped drain region (LDD) in the semiconductor substrate between the channel region of the substrate (beneath the gate electrode and gate oxide) and the more heavily doped source/drain regions of the device. This lightly doped drain region (LDD) between the channel and the more heavily doped conventional drain region reduces the electric field which mitigates short-channel effects, reduces hot-carrier generation, and increases the junction breakdown voltage. Such LDD regions are usually formed on both sides of the channel, since either of the source/drain regions are capable of functioning as a drain region, depending upon how the device is later electrically connected to the reminder of the integrated circuit structure.

Conventionally, as illustrated in FIG. 1, MOSFET devices with LDD regions are formed by first forming a gate oxide 10 and overlying polysilicon gate electrode 12 over a portion of an exposed region of a semiconductor substrate 2 at least partially surrounded by field oxide 8 which electrically isolates the MOSFET device from other structures in the substrate. The structure is then blanket implanted with a light dose of a dopant to form either N– or P– LDD regions 16 and 18 in substrate 2, depending upon whether or not an NMOS or PMOS device is to be formed. In the illustrated structure shown in FIG. 1, an NMOS device is being formed in a P doped substrate, so lightly doped N– regions are shown being formed using a blanket doping of arsenic (or phosphorus).

After N– doped LDD regions 16 and 18 are formed, a conformal layer of oxide ($SiO_2$) is formed over the entire structure and then anisotropically etched away, leaving only oxide shoulders or spacers 20 on the sidewalls of gate electrode 12, as shown in FIG. 2, which serve to mask portions of previously N– doped regions 16 and 18. The structure is then blanket doped with an N+ dosage of arsenic (or phosphorus) to form N+ source and drain regions 26 and 28 in the unmasked portions of N– doped regions 16 and 18 in substrate 2, leaving N– doped regions 16a and 18a in substrate 2. As shown in FIG. 2, the resulting N+ source/drain regions 26 and 28 are then respectively separated from the channel region 6 of substrate 2 beneath gate oxide 10 and gate electrode 12 by LDD regions 16a and 18a. PMOS devices having LDD regions are similarly constructed using an N doped substrate or an N well, with a P type dopant, such as boron, then used for the respective P– and P+ doping steps.

Following the formation of source/drain regions 26 and 28 in substrate 2, a metal layer, such as titanium, capable of reacting with silicon (the exposed source/drain portions of the silicon substrate and the polysilicon gate electrode) to form metal silicide may be deposited over the entire structure and metal silicide contacts may then be formed by heating to cause the titanium to react with the silicon to form titanium silicide contacts which provide superior electrical contacts to a subsequently deposited metal layer than would the silicon itself. The unreacted metal is then removed, leaving only the metal silicide contacts.

While such prior art methods of forming MOS devices with LDD regions are acceptable, the ever shrinking dimensions of VLSI structures results in thinner layers being formed and increased sensitivity to the length and extend of exposure to heat (thermal budgets) needed to provide annealing and activation of dopants. Forming LDD regions prior to the formation and annealing of the heavily doped source/drain regions, as well as prior to the formation of the metal silicide contacts results in additional and undesirable exposure of the lightly doped drain (LDD) regions to several heating steps, thus unacceptably raising the thermal budget with respect to such LDD regions, resulting in further diffusion of the dopant in the LDD regions.

It would, therefore, be desirable if, in the formation of MOSFET devices in a semiconductor substrate, the heavily doped source/drain regions could be formed (implanted and annealed/activated) prior to formation of the LDD regions in the substrate. Preferably, the metal silicide contacts would also be formed prior to formation of the LDD regions, to thereby minimize the exposure of the LDD regions to additional heat.

SUMMARY OF THE INVENTION

In accordance with the invention, LDD regions of a MOSFET device in an integrated circuit structure are formed in a semiconductor substrate after formation of the source/drain regions of the MOSFET device by forming spacers on the sidewalls of the gate electrode prior to doping of the substrate to form source/drain regions by implantation and annealing/activating, and preferably prior to formation of the metal silicide contacts. The sidewall spacers are then removed, and the portion of the substrate exposed by removal of the spacers is then lightly doped to form the desired LDD regions in the substrate. In accordance with the invention, the dopant used to form the LDD regions is, therefore, not exposed to the heat used to anneal and activate the implanted source/drain regions, nor the heat used to form the metal silicide contacts.

DETAILED DESCRIPTION OF THE INVENTION

Figure 3:
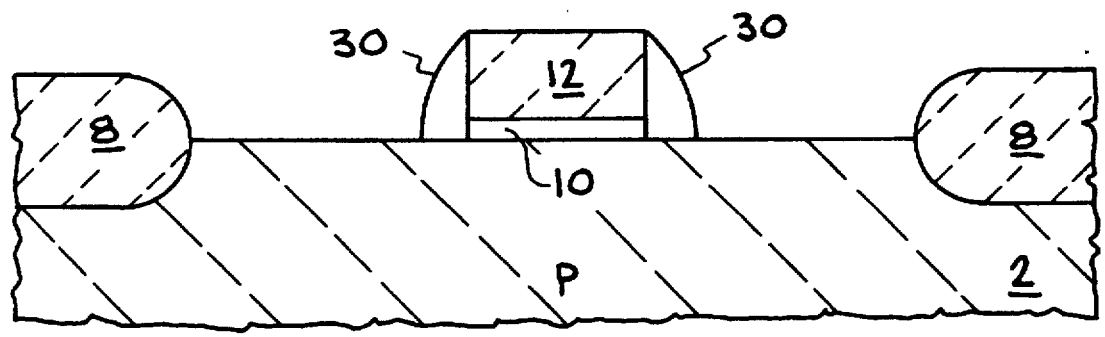
FIG. 3 is a fragmentary vertical side-section view illustrating the formation, prior to doping of the substrate, of spacers on the sidewalls of a polysilicon gate electrode formed over a gate oxide layer on a silicon semiconductor substrate, in accordance with the invention.

Referring now to FIG. 3, a P doped substrate 2 is shown having field oxide portions 8 already formed therein and having a gate oxide 10 formed on a portion of the surface of substrate 2 and a polysilicon gate electrode 12 formed over gate oxide 10. It should be noted that for purposes of illustration, and not of limitation, the construction of an NMOS structure will be illustrated herein, it being understood that the invention applies equally to the construction of a PMOS device as well.

Figure 1:
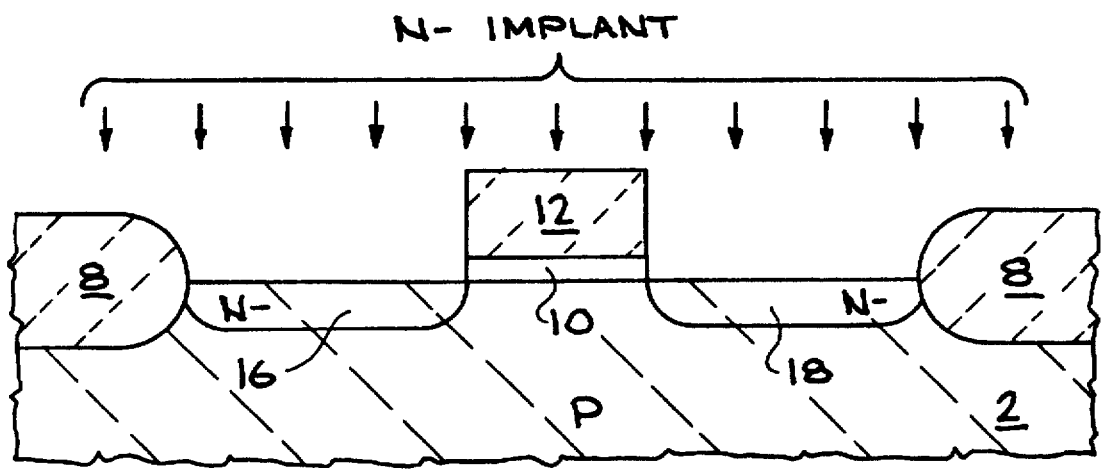
FIG. 1 is a fragmentary vertical side-section view illustrating the prior art construction of an NMOS device with N– LDD regions, showing the N– implantation of a semiconductor substrate after formation of the gate oxide and overlying polysilicon gate electrode, thereby forming N– regions in the substrate extending from the channel region beneath the gate electrode and gate oxide to the field oxide boundaries.

Up to this point, the structure will be noted to be the same as that shown in prior art FIG. 1. However, in accordance with the invention, the next step is not to implant the exposed portions of the substrate with an N- implant, as in the prior art. Rather the next step in the process of the invention is to form spacers 30 on the sidewalls of gate electrode 12 and gate oxide 10, as shown in FIG. 3.

Figure 2:
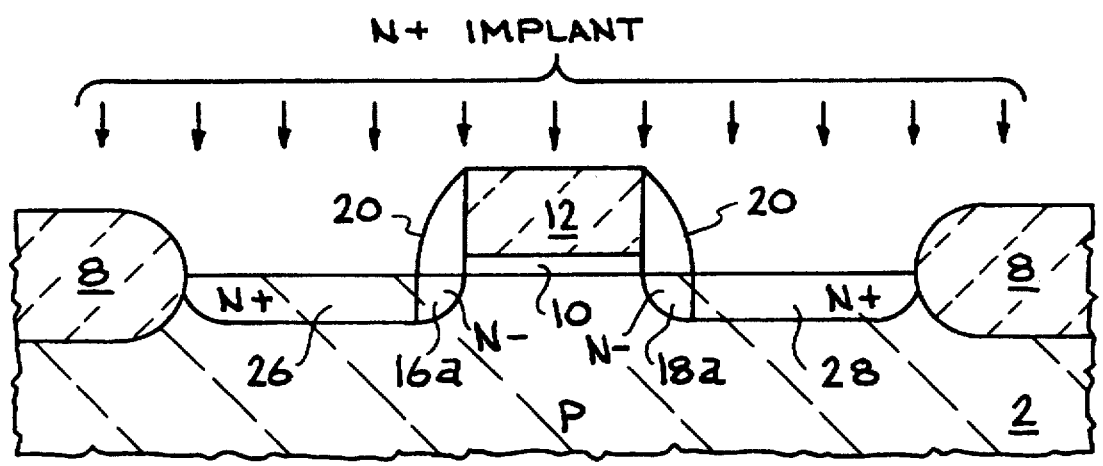
FIG. 2 is a fragmentary vertical side-section view of the prior art structure of FIG. 1 after oxide spacers have been formed on the sidewalls of the gate electrode, and illustrating the prior art N+ implantation of those portions of the previously implanted N– regions not masked by the oxide spacers to thereby form the N+ source/drain regions separated from the channel region in the substrate beneath the gate electrode by N– LDD regions.

Similar to the prior art process used to form silicon oxide spacers (such as spacers 20 in prior art FIG. 2), a conformable layer of the spacer material is first deposited over the entire structure and an anisotropic etch is then performed to remove all of the layer except for spacers 30 on the sidewalls of gate electrode 12 and underlying gate oxide 10.

However, unlike the prior art spacers, in accordance with the invention, spacers 30 are formed prior to any doping of the substrate to form the source/drain regions of the MOS device being constructed. Furthermore, spacers 30 of the invention are then removed at a later step in the process of forming the MOS structure. Therefore, the spacer material us ed to form spacer s 30 preferably comprises a material which can be easily removed from the integrated circuit structure, most preferably without the use of convention al etching systems such as wet etchants (such as acid s or bases or organic materials), or dry etching systems.

In one embodiment, spacers 30 are formed of a material which may be washed away with water when the spacers 30 are to be removed in the process of the invention. Such a water soluble material must also be compatible with the remaining portions of the integrated circuit structure being constructed on/in the semiconductor substrate, e.g., compatible with semiconductor materials, dopants, metals, insulation layers, etc. Amorphous germanium dioxide (not the water-insoluble tetragonal germanium dioxide form) is an example of a water-soluble material which may be used to form the spacers of the invention which will be compatible with other materials used in the construction of the integrated circuits structures on the semiconductor substrate. The soluble germanium dioxide ($GeO_2$) may be formed over the integrated circuit structure by CVD using a gaseous mixture of germane, and a gaseous source of oxygen such as $NO_2$, $O_2$, $O_3$, or mixture of same, or other commonly used oxidizing agent, as the respective sources of germanium and oxygen.

In another embodiment, spacers 30 may be formed of a sublimable or decomposable material which can be subsequently removed when exposed to heat. Germanium dinitride ($Ge_3N_2$) is an example of a material which will sublime upon heating (to a temperature in excess of 650° C.), and which will be compatible with other materials used in the construction of the integrated circuits structures on the semiconductor substrate. The germanium dinitride ($Ge_3N_2$) may be formed over the integrated circuit structure by CVD using a gaseous mixture of nitrogen and germane as the respective sources of nitrogen and germanium. Other possible materials which could be used in this embodiment include germanium tetranitride ($Ge_3N_4$), which decomposes at 450° C., and germanium monoxide (GeO), which sublimes at temperatures in excess of 710° C.

After deposition of the layer of the particular water-soluble spacer material, or spacer material capable of either decomposition or sublimation with heating, the layer of spacer material is subject to an anisotropic etch to remove all of the layer save spacers 30 on the sidewalls of gate electrode 12 and gate oxide 10, as shown in FIG. 3. The etchant system used for the anisotropic etch to form the spacers of the invention may comprise the same etchant system used to conventionally form the prior art oxide spacers on the sidewalls of the gate electrode.

Figure 4:
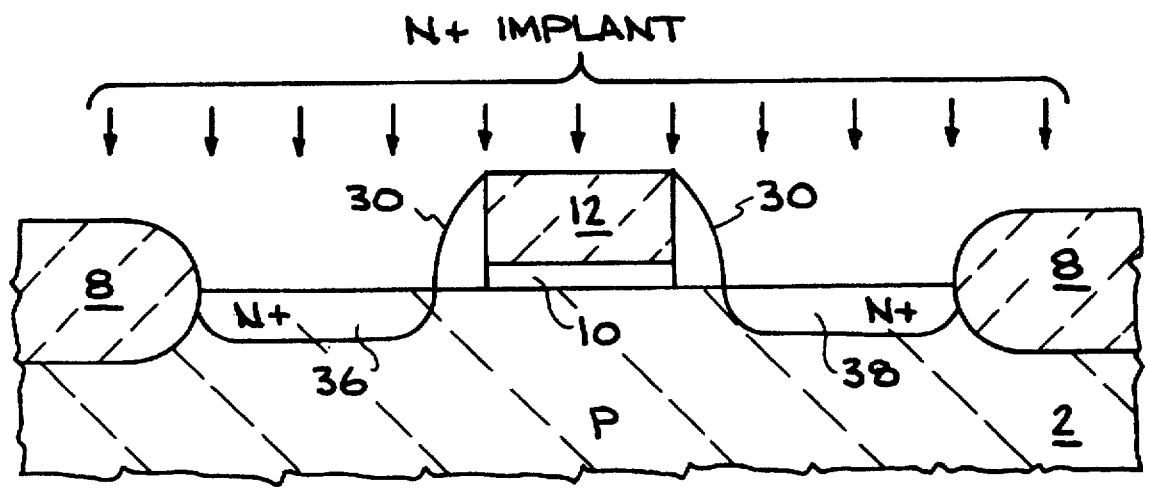
FIG. 4 is a fragmentary vertical side-section view of the structure of FIG. 3 showing an N+ implantation being performed to form N+ source/drain regions in the silicon substrate prior to formation of the N- LDD regions in the substrate, with the spacers masking, during the N+ implant, those portions of the silicon substrate where the N- LDD regions will be subsequently formed.
Figure 5:
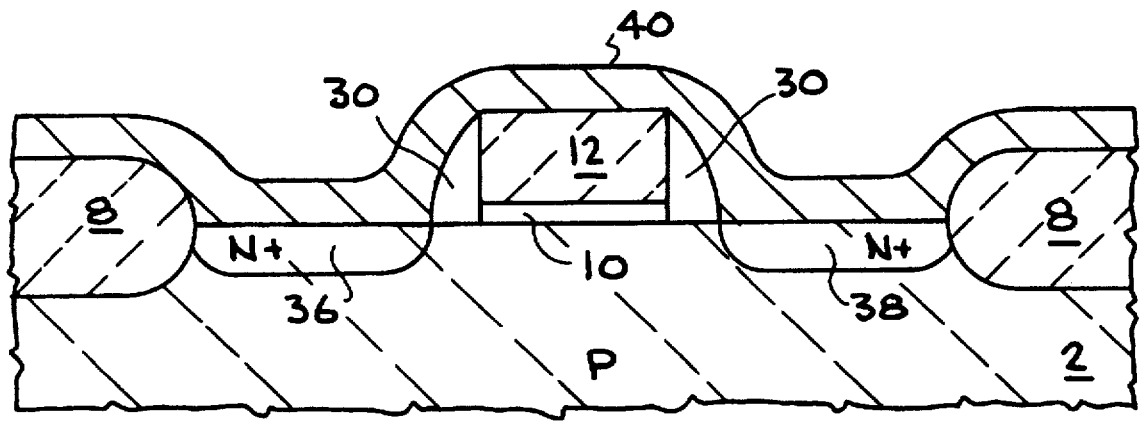
FIG. 5 is a fragmentary vertical side-section view of the structure of FIG. 4 showing the blanket deposition of a metal layer capable of reacting with exposed portions of the underlying silicon substrate and polysilicon gate electrode to form metal silicide contacts.

As shown in FIG. 4, following the formation of spacers 30, in accordance with the invention, the remaining exposed portions of the silicon substrate are implanted with an N+ dopant such as arsenic (or phosphorus) at a dosage level in excess of about $5 \times 10_{15}$ arsenic atoms/cm$^2$, up to about $10_{16}$ arsenic atoms/cm$^2$, to form N+ regions 36 and 38 in substrate 2 which will serve as the source/drain regions of the NMOS device being constructed. After implantation of the substrate with the N+ dopant, the substrate is annealed to diffuse and activate the N+ dopant to form N+ source/drain regions 36 and 38 in substrate 2.

In the preferred embodiment, metal silicide contacts are now formed over the source/drain regions and polysilicon gate electrode region of the MOS device. As shown in FIG.

5, this is accomplished by first blanket depositing a conformal layer 40 of a metal capable of selectively reacting with the exposed silicon substrate surfaces over source/drain regions 36 and 38 and the exposed upper surface of polysilicon gate electrode 12 to form metal silicide. Examples of metals capable of so reacting with silicon to form metal silicide include metals such as titanium or tungsten. For purposes of illustration, and not of limitation, conformal metal layer 40 will be referred herein to as a layer of titanium.

Figure 6:
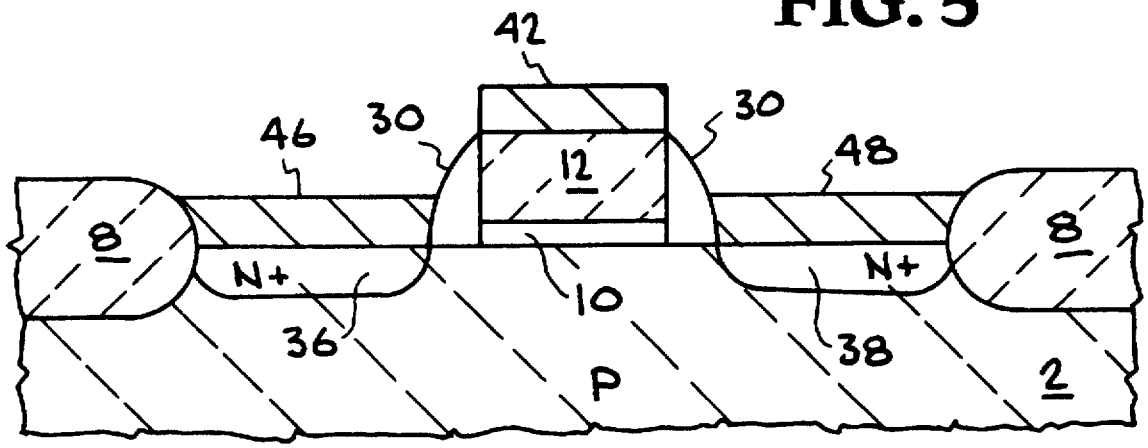
FIG. 6 is a fragmentary vertical side-section view of the structure of FIG. 5 after reaction of the metal layer with the exposed portions of the underlying silicon substrate and polysilicon gate electrode, and after removal of the unreacted portions of the metal layer, illustrating the metal silicide contacts respectively formed over the source/drain regions of the silicon substrate and the upper surface of the polysilicon gate electrode.

Following the deposition of titanium layer 40 over the integrated circuit structure shown in FIG. 4, the structure is annealed in an inert or reducing atmosphere to a temperature in excess of 500° C. to cause the titanium in contact with either the silicon substrate of the polysilicon gate electrode to react to form titanium silicide. The remaining unreacted titanium is then removed from the structure, following which (at least in the specific case of titanium), the structure may be further annealed at a higher temperature, e.g., 700°–800° C., to cause the titanium silicide initially formed at the first annealing temperature to convert into a more electrically suitable phase (convert from C49 phase to C54 phase). FIG. 6 shows the resulting titanium silicide source/drain contacts 46 and 48 formed over source/drain regions 36 and 38, and titanium silicide contact 42 formed over gate electrode 12.

Figure 7:
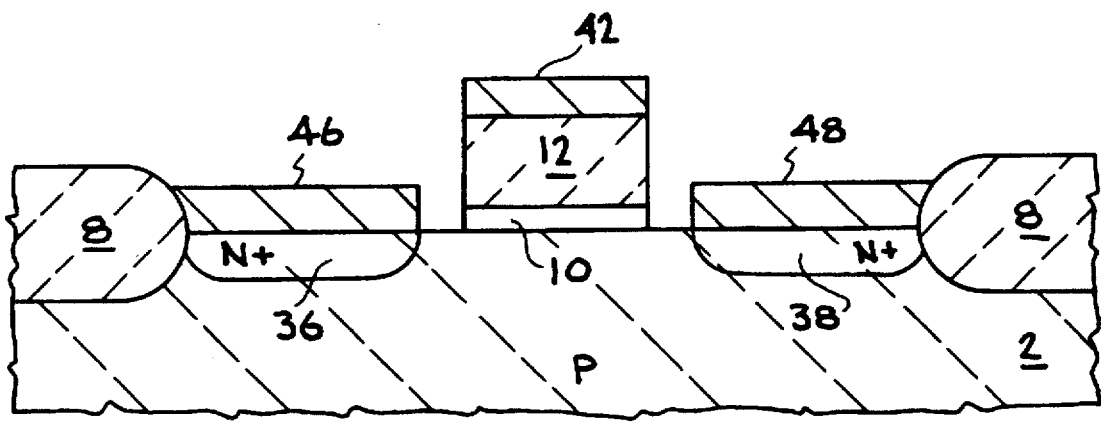
FIG. 7 is a fragmentary vertical side-section view of the structure of FIG. 6 showing subsequent removal of the spacers from the sidewalls of the gate electrode, thereby exposing portions of the silicon substrate not previously implanted.

Following the formation of titanium silicide contacts 42, 46, and 48, spacers 30 are, in accordance with the invention, removed, as illustrated in FIG. 7. As discussed above, when spacers 30 are formed of a water-soluble material, the semiconductor substrate may be either sprayed or immersed in hot deionized water (e.g., boiling water) to wash spacers 30 off the substrate. When the spacer material comprises a sublimable or decomposable material, the substrate is heated to the appropriate temperature, and then maintained at that temperature, until spacers 30 are completely sublimed or decomposed.

It should be noted, however, that when both N channel and P channel devices are being formed in the same substrate, both the N+ and P+ source/drain regions are implanted and annealed/activated first, prior to removal of the spacers. After formation of both the N+ and P+ source/drain regions (with appropriate masking), all of the spacers are removed, and the respective N– and P– LDD regions are then formed (in separate steps), with the PMOS regions masked while forming the N– LDD regions and the NMOS regions masked while forming the P– LDD regions.

Figure 8:
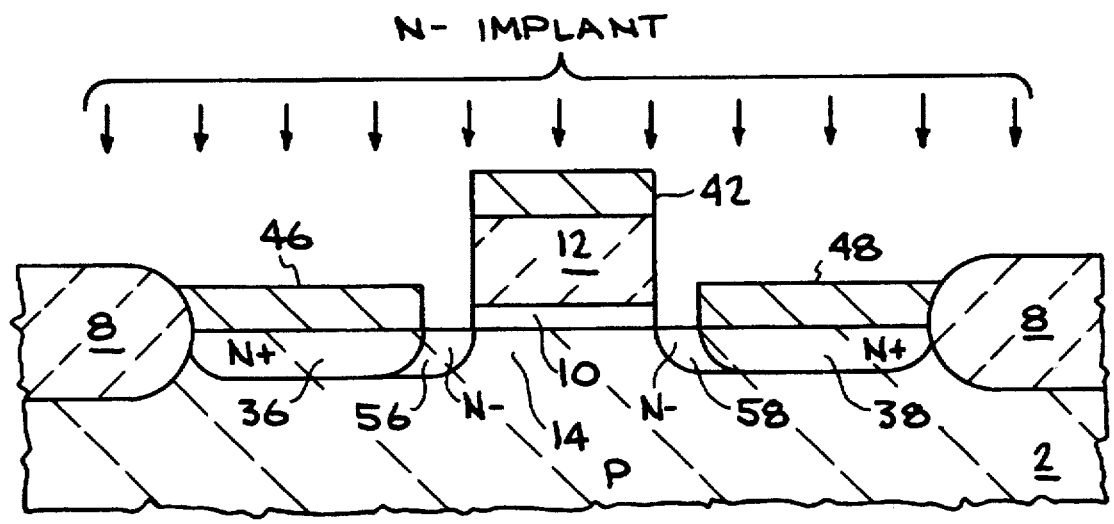
FIG. 8 is a fragmentary vertical side-section view of the structure of FIG. 7 showing the N- implantation of those portions of the silicon substrate exposed by the removal of the spacers to thereby form N- LDD regions in the silicon substrate between the previously formed N+ source/drain regions and the channel region of the MOSFET device underlying the gate electrode and gate oxide.

The portions of semiconductor substrate newly exposed by removal of spacers 30 are then implanted using an N– dopant such as arsenic (or phosphorus) at a dosage level of about $10_{13}$ to about $10_{15}$ arsenic atoms/cm$^2$ to form lightly doped drain (LDD) regions 56 and 56, which then respectively separate N+ doped source/drain regions 36 and 38 from the channel region of substrate 2 below gate oxide 10, denoted as region 14 in FIG. 8. After the implantation of the N– dopant (and the P– dopant when P– LDD regions are also being formed), the structure is subject to a short anneal, such as a rapid thermal anneal (RTA) for a period of, for example, 950° C. for about 30 seconds to anneal/activate both the N– LDD regions and the P– LDD regions at the same time.

Figure 9:
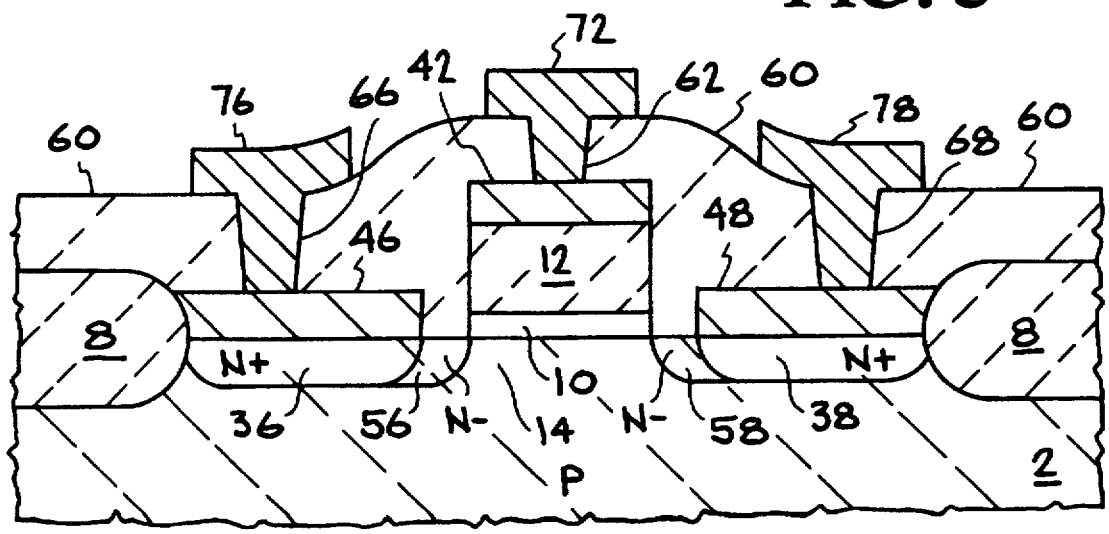
FIG. 9 is a fragmentary vertical side-section view of the structure of FIG. 8 after formation of a further insulation layer over the structure of FIG. 8, contact openings cut through the insulation layer to the underlying source/drain regions and the gate electrode, and metal contacts formed by depositing a metal layer over the insulation layer and in the contact openings, followed by patterning of the metal layer.

After formation of LDD regions 56 and 58, (as well as the P– LDD regions when PMOS devices are also being constructed) the structure may be subjected to various conventional processing steps to complete the integrated circuit device. As seen in FIG. 9, such steps may include the deposition of a conformal insulation layer 60, such as a silicon oxide ($SiO_2$) layer, over the structure, followed by the formation of contact openings 62, 66, and 68 therethrough respectively to the underlying metal silicide contacts 42, 46, and 48. A metal contact layer, such as an aluminum layer (or gold, tungsten, etc.), is then deposited over the structure to fill contact openings 62, 66, and 68, after which the metal contact layer is patterned to form metal gate contact 72, and source/drain metal contacts 76 and 78.

Thus, in accordance with the invention, an MOSFET structure is formed having LDD regions respectively separating the more heavily doped source/drain regions from the channel region beneath the gate oxide and gate electrode without, however, subjecting the LDD regions either to the additional heating used to anneal/active the implanted N+ or P+ source/drain regions, or to the heat used to form the metal silicide contacts over the gate electrode and source/drain regions. By forming the LDD regions after formation of the source/drain regions, and after the formation of the metal silicide contacts, and thereby limiting the heat exposure of the LDD regions, excessive diffusion of the dopant used to form the LDD regions will not occur.

Having thus described the invention what is claimed is:

1. A process for forming in a semiconductor substrate a MOSFET device with lightly doped drain (LDD) regions which comprises:
   a) forming a gate oxide over a portion of an exposed region of said semiconductor substrate at least partially surrounded by insulation, and a gate electrode over said gate oxide;
   b) forming decomposable spacers on the sidewalls of said gate electrode;
   c) implanting exposed portions of said semiconductor substrate with either P+ or N+ dopant to implant source/drain regions in said substrate;
   d) heating said substrate sufficiently to anneal and activate said dopant implanted into said substrate to form said source/drain regions;
   e) removing said decomposable spacers from said sidewalls of said gate electrode after formation of said source/drain regions by heating said decomposable spacers to a temperature at which said spacers decompose, and maintaining that temperature until said spacers are removed; and
   f) then implanting the portions of said semiconductor substrate exposed by removal of said spacers with a P– or N– dopant to form said LDD regions between said source/drain regions and a channel region in said substrate below said gate oxide;

whereby said dopant in said LDD regions is not exposed to the heat used to anneal and activate the dopant in said source/drain regions during the formation of said source/drain regions.

2. A process for forming in a semiconductor substrate a MOSFET device with lightly doped drain (LDD) regions which comprises:
   a) forming a gate oxide over a portion of an exposed region of said semiconductor substrate at least partially surrounded by insulation, and a gate electrode over said gate oxide;
   b) forming spacers on the sidewalls of said gate electrode, said spacers formed from a material selected from the group consisting of amorphous germanium dioxide, germanium dinitride, germanium monoxide, and germanium tetranitride;
   c) implanting exposed portions of said semiconductor substrate with either P+ or N+ dopant to implant source/drain regions in said substrate;

d) heating said substrate sufficiently to anneal and activate said dopant implanted into said substrate to form said source/drain regions;

e) removing said spacers from said sidewalls of said gate electrode after formation of said source/drain regions; and f) then implanting the portions of said semiconductor substrate exposed by removal of said spacers with a P− or N− dopant to form said LDD regions between said source/drain regions and a channel region in said substrate below said gate oxide;

whereby said dopant in said LDD regions is not exposed to the heat used to anneal and activate the dopant in said source/drain regions during the formation of said source/drain regions.

3. A process for forming in a semiconductor substrate a MOSFET device with lightly doped drain (LDD) regions which comprises:

a ) forming a gate oxide over a portion of an exposed region of said semiconductor substrate at least partially surrounded by insulation, and a gate electrode over said gate oxide;

b) forming sublimable spacers on the sidewalls of said gate electrode;

c) implanting exposed portions of said semicondutor substrate with either P+ or N+ dopant to implant source/drain regions in said substrate;

d) heating said substrate sufficiently to anneal and activate said dopant implanted into said substrate to form said source/drain regions;

e) removing said sublimable spacers from said sidewalls of said gate electrode after formation of said source/drain regions by heating said substrate to a temperature at which said spacers sublime , and maintaining this temperature until said spacers are removed; and f) then implanting the portions of said semiconductor substrate exposed by removal of said spacers with a P− or N− dopant to form said LDD regions between said source/drain regions and a channel region in said substrate below said gate oxide;

whereby said dopant in said LDD regions is not exposed to the heat used to anneal and activate the dopant in said source/drain regions during the formation of said source/drain regions.

4. The process of claim 3 wherein said sublimable spacers comprise germanium monoxide (GeO).

5. The process of claim 1 wherein said decomposable spacers comprise germanium tetranitride ($Ge_3N_4$).

6. A process for forming in a semiconductor substrate a MOSFET device with lightly doped drain (LDD) regions which comprises:

a ) forming a gate oxide over a portion of an exposed region of said semiconductor substrate at least partially surrounded by insulation, and a gate electrode over said gate oxide;

b) forming water-soluble spacers on the sidewalls of said gate electrode;

c) implanting exposed portions of said semiconductor substrate with either P+ or N+ dopant to implant source/drain regions in said substrate;

d) heating said substrate sufficiently to anneal and activate said dopant implanted into said substrate to form said source/drain regions;

e) removing said water-soluble spacers from said sidewalls of said gate electrode after formation of said source/drain regions by contacting said water-soluble spacers with water until said spacers are removed; and f) then implanting the portions of said semiconductor substrate exposed by removal of said spacers with a P− or N− dopant to form said LDD regions between said source/drain regions and a channel region in said substrate below said gate oxide;

whereby said dopant in said LDD regions is not exposed to the heat used to anneal and activate the dopant in said source/drain regions during the formation of said source/drain regions.

7. The process of claim 6 wherein said semiconductor substrate comprises a silicon substrate and said gate electrode comprises a polysilicon gate electrode, and which further includes the step of forming metal silicide contacts over said source/drain regions in said silicon substrate and over said gate electrode after formation of said source/drain regions and prior to formation of said LDD regions, whereby said dopant in said LDD regions is not exposed to the heat used to form said metal silicide contacts.

8. The process of claim 6 wherein said spacers comprise amorphous germanium dioxide.

9. The process of claim 2 wherein said spacers comprise germanium dinitride, and said step of removing said germanium dinitride spacers further comprises heating said substrate to a temperature at which said germanium dinitride spacers sublime, and maintaining this temperature until said germanium dinitride spacers are removed.

10. The process of claim 9 wherein said step of heating said substrate to a temperature at which said germanium dinitride spacers sublime further comprises heating said substrate to a temperature over 650° C.

11. The process of claim 7 wherein said step of forming said metal silicide contacts over said source/drain regions in said silicon substrate and on said polysilicon gate electrode further includes the steps of:

a) blanket depositing over said integrated circuit structure a metal capable of reacting with silicon to form a metal silicide;

b) heating said substrate to form said metal silicide contacts; and c) removing unreacted metal from said integrated circuit structure.

12. The process of claim 2 wherein said spacers comprise a water-soluble material and said step of removing said spacers comprises contacting said spacers with water until said spacers are removed.

13. The process of claim 2 wherein said spacers comprise a sublimable material and said step of removing said spacers comprises heating said substrate to a temperature at which said spacers sublime, and maintaining this temperature until said spacers are removed.

14. The process of claim 2 wherein said spacers comprise a decomposable material and said step of removing said spacers comprises heating said substrate to a temperature at which said spacers decompose, and maintaining this temperature until said spacers are removed.

15. The process of claim 3 wherein said sublimable spacers comprise germanium dinitride, and said step of removing said germanium dinitride spacers further comprises heating said substrate to a temperature over 650° C. to sublime said germanium dinitride spacers, and maintaining this temperature until said germanium dinitride spacers are removed.

* * * * *